United States Patent
Lee et al.

(10) Patent No.: US 7,659,174 B2
(45) Date of Patent: Feb. 9, 2010

(54) METHOD TO ENHANCE DEVICE PERFORMANCE WITH SELECTIVE STRESS RELIEF

(75) Inventors: Yong Meng Lee, Singapore (SG); Haining S. Yang, Wappingers Falls, NY (US); Victor Chan, Newburgh, NY (US)

(73) Assignees: Chartered Semiconductor Manufacturing, Ltd., Singapore (SG); International Business Machines Corporation (IBM), Armonk, NY (US)

( * ) Notice: Subject to any disclaimer, the term of this patent is extended or adjusted under 35 U.S.C. 154(b) by 149 days.

(21) Appl. No.: 11/930,230

(22) Filed: Oct. 31, 2007

(65) Prior Publication Data

US 2008/0050868 A1    Feb. 28, 2008

Related U.S. Application Data

(63) Continuation of application No. 11/299,542, filed on Dec. 12, 2005, now Pat. No. 7,309,637.

(51) Int. Cl.
*H01L 21/336* (2006.01)

(52) U.S. Cl. .............. 438/303; 438/301; 438/305; 257/E21.415; 257/E21.564

(58) Field of Classification Search .............. 438/303, 438/301, 305, 592, 586, 723; 257/E21.415, 257/E21.564, E21.572, E21.43, E21.438
See application file for complete search history.

(56) References Cited

U.S. PATENT DOCUMENTS

| 6,573,172 | B1 | 6/2003 | En et al. |
| 2005/0093030 | A1 | 5/2005 | Doris et al. |
| 2005/0093059 | A1 | 5/2005 | Belyansky et al. |
| 2005/0093078 | A1* | 5/2005 | Chan et al. .................. 257/374 |
| 2005/0260810 | A1 | 11/2005 | Cheng et al. |

* cited by examiner

*Primary Examiner*—Walter L Lindsay, Jr.
(74) *Attorney, Agent, or Firm*—Horizon IP Pte Ltd

(57) ABSTRACT

A structure and method of fabrication of a semiconductor device having a stress relief layer under a stress layer in one region of a substrate. In a first example, a stress relief layer is formed over a first region of the substrate (e.g., PFET region) and not over a second region (e.g., NFET region). A stress layer is over the stress relief layer in the first region and over the devices and substrate/silicide in the second region. The NFET transistor performance is enhanced due to the overall tensile stress in the NFET channel while the degradation in the PFET transistor performance is reduced/eliminated due to the inclusion of the stress relief layer. In a second example embodiment, the stress relief layer is formed over the second region, but not the first region and the stress of the stress layer is reversed.

18 Claims, 6 Drawing Sheets

METHOD TO ENHANCE DEVICE PERFORMANCE WITH SELECTIVE STRESS RELIEF

CROSS REFERENCES TO RELATED APPLICATIONS

This application is a Continuation application which claims benefit of co-pending U.S. patent application Ser. No. 11/299,542 filed Dec. 12, 2005. This application is hereby incorporated by reference in its entireties.

FIELD OF THE INVENTION

This invention relates generally to fabrication of semiconductor devices and more particularly to methods for selectively inducing stress in the PMOS and NMOS transistors using a overlying stress inducing layer.

DESCRIPTION OF THE PRIOR ART

As semiconductor device speeds continue to increase and operating voltage levels continue to decrease, the performance of MOS and other types of transistors needs to be correspondingly improved. The carrier mobility in a MOS transistor has a significant impact on power consumption and switching performance, where improvement in carrier mobility allows faster switching speeds. The carrier mobility is a measure of the average speed of a carrier (e.g., holes or electrons) in a given semiconductor, given by the average drift velocity of the carrier per unit electric field. Improving carrier mobility can improve the switching speed of a MOS transistor, as well as allow operation at lower voltages.

One way of improving carrier mobility involves reducing the channel length and gate dielectric thickness in order to improve current drive and switching performance. However, this approach may increase gate tunneling current, which in turn degrades the performance of the device by increasing off state leakage. In addition, decreasing gate length generally calls for more complicated and costly lithography processing methods and systems.

Other attempts at improving carrier mobility include deposition of silicon/germanium alloy layers between upper and lower silicon layers under compressive stress, which enhances hole carrier mobility in a channel region. However, such buried silicon/germanium channel layer devices have shortcomings, including increased alloy scattering in the channel region that degrades electron mobility, a lack of favorable conduction band offset which may even mitigate the enhancement of electron mobility, and the need for large germanium concentrations to produce strain and thus enhanced mobility.

Thus, there remains a need for methods by which the carrier mobility of both NMOS and PMOS transistors may be improved, without significantly adding to the cost or complexity of the manufacturing process.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

Suey Li Toh, K. P. Loh, C. B. Boothroyd, K. Li, C. H. Ang, E. Er, and L. Chan; ARTICLE: Reduction of Local Mechanical Stress in a Transistor Using Si3N4 SiOxNy Contact ESL; Electrochemical and Solid-State Letters, 8 (2) G38-G40 (2005) 1099-0062/2004/8(2)/G38/3/$7.00© The Electrochemical Society, Inc. Found on website: www-hrem.msm.cam.ac.uk/~cbb/publications/pdf/130%20Suey%20Li.pdf U.S. Pat. No. 6,573,172: Methods for improving carrier mobility of PMOS and NMOS devices—Fabrication of semiconductor device by forming P-channel and N-channel metal oxide semiconductor transistors in wafer, forming tensile film on P-channel transistor and forming compressive film on N-channel transistor—Inventor: En, William George; Milpitas, Calif.

U.S. Pat. No. 6,284,610: Cha—Method to reduce compressive stress in the silicon substrate during silicidation—Silicidation of source/drain junctions in the manufacture of integrated circuit, involves depositing buffer oxide layer overlying semiconductor substrate and gate electrode.

US 20040159886 A1 Lee, Sang-Eun; et al.—Method of manufacturing a semiconductor integrated circuit using a selective disposable spacer technique and semiconductor integrated circuit manufactured thereby.

U.S. Pat. No. 6,348,389: Chou et al.—Method of forming and etching a resist protect oxide layer including end-point etch—Formation and etching of resist protect oxide layer, involves forming shallow trench isolation on semiconductor substrate, and depositing and etching the resist protect oxide layer using endpoint etch mode.

US20020142606A1—Yoon—Method for forming a borderless contact of a semiconductor device—A method for forming a borderless contact of a semiconductor device includes forming a gate electrode on a field oxide of the semiconductor substrate, patterning a stacked structure of a buffer layer and an etching barrier layer on sidewalls of the gate electrode and on the field oxide, forming a silicide layer on the gate electrode and an active region exposed by the stacked structure, and forming the borderless contacts to reduce or prevent leakage current between the semiconductor device and the metal lines and degradation resulting from stresses inherent in the prior art nitride etching barrier layer by reducing abnormal oxidation associated with the buffer oxide layer under the etching barrier layer.

U.S. Pat. No. 5,252,848—Adler—Low on resistance field effect transistor.

SUMMARY OF THE INVENTION

The present invention relates to methods for forming a semiconductor device. In one embodiment, the method includes providing a substrate having first and second regions defined thereon. The first region comprises a first transistor and the second region comprises a second transistor. A stress relief layer is formed on the second region of the substrate to cover the second transistor. The method further comprises the step of forming a stress layer on first and second regions of the substrate, the stress layer having a first stress, the stress layer covering the stress relief layer on the second region, wherein the first stress of the stress layer improves the performance of the first transistor. The stress relief layer comprises a neutral stress or a second stress opposite the first stress of the stress layer to reduce performance degradation of the second transistor caused by the first stress layer.

In another embodiment of the invention, the method includes defining first and second regions on a substrate. The first and second transistors are formed in first and second regions. A stress relief layer is deposited on the second region of the substrate to cover the second transistor. The method further comprises the step of depositing a stress layer on first and second regions of the substrate, the stress layer having a first stress; the stress layer covers the stress relief layer on the second region, wherein the first stress of the stress layer improves the performance of the first transistor. The stress layer comprises a neutral stress or a second stress opposite the first stress of the stress layer to reduce performance degradation of the second transistor caused by the first stress layer.

In yet another embodiment of the invention, the method comprises the step of providing a substrate having first and second regions defined thereon. The first region comprises a first transistor and a second region comprises a second transistor. A stress relief layer is formed on the second region of the substrate to cover the second transistor and not on the first region. A stress layer is formed in first and second regions of the substrate. The stress layer has a first stress and covers the stress relief layer on the second region, wherein the first stress on the stress layer improves performance of the first transistor. The stress relief layer comprises a neutral stress or a second stress opposite the first stress of the stress layer to reduce performance degradation of the second transistor caused by the first stress layer.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

The example embodiments of the present invention will be described in detail with reference to the accompanying drawings. Example embodiments comprise forming a stress relief layer over a first region (e.g., PFET or NFET region) and forming an overlying stress layer (e.g., compressive or tensile) over the at least the first region and preferably over a first and second region (e.g., both PFET and NFET regions). The stress relief layer can have a neutral stress or a stress opposite the stress of the overlying stress layer.

In a first example embodiment, shown in FIGS. 1 to 5, a stress relief layer 64 is formed over a PFET and a tensile stress layer 70 is formed both PFET and NFET devices. In a second embodiment shown in FIG. 6, a stress relief layer 64A is formed over a NFET and a compressive stress layer 70A formed both PFET and NFET devices.

A. Nomenclature

Tensile Stress Layers

For a NFET, a tensile stress layer over the NFET improves NFET device performance.

For a NFET, a tensile stress layer over the NFET improves NFET device performance by putting a tensile stress on the NFET channel.

Compressive Stress Layer

A compressive stress layer induces a compressive stress in the channel of a PFET.

For a PFET, a compressive stress layer over the PFET improves PFET device performance.

For a PFET, a compressive stress layer over the PFET improves PFET device performance by producing a compressive stress on the channel on the PFET channel.

Channel direction is the direction from source to drain and the direction current flows. Channel length is the distance between source and drain.

A positive sign for a strain/stress component is a tensile strain while a negative sign is a compressive strain.

II. First Example Embodiment

A first example embodiment shown in FIGS. 1 to 5 shows a method of fabrication of a semiconductor device having a stress relief layer.

Figure 5:
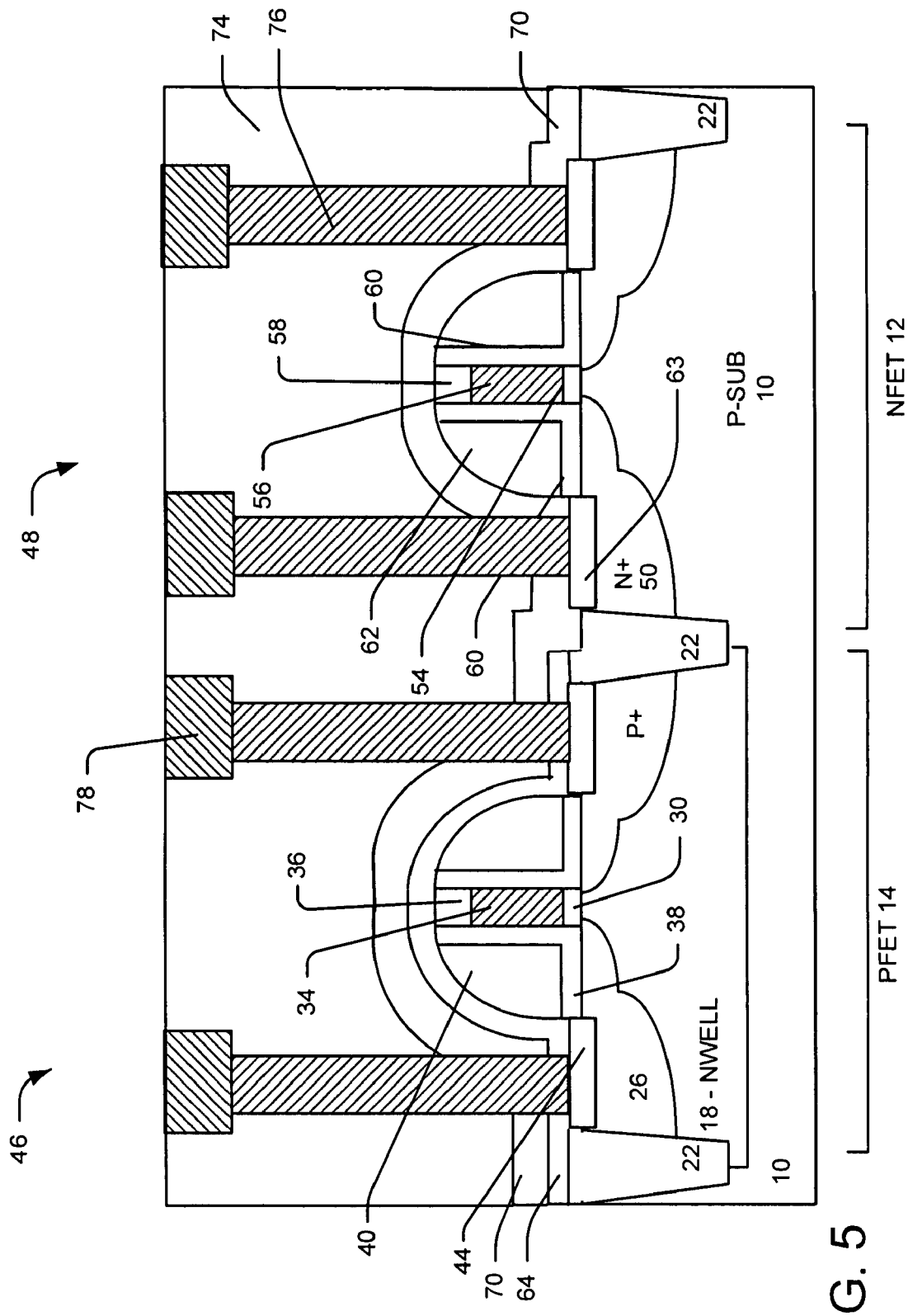

In this example, as shown in FIG. 5, a stress relief layer 64 is formed over a first region of the substrate (e.g., PFET region 14) and not over a second region (e.g., NFET region 12). A stress layer (e.g., nitride layer) 70 is over the stress relief layer 64 in the first region 14 and on the substrate 10/silicide 63 in the second region 12.

The NFET TX device 48 performance is enhanced due to the overall tensile stress (e.g., nitride 70) while the degradation in the PFET Tx 46 performance is reduced/eliminated due to the inclusion of the stress relief layer. The stress relief layer 64 can have a neutral or opposite stress as the overlying stress layer 70.

A. Provide a Substrate with a PFET Region and a NFET Region

We provide a substrate with first region where first type devices can be made and a second region where second type devices can be made.

Figure 1:
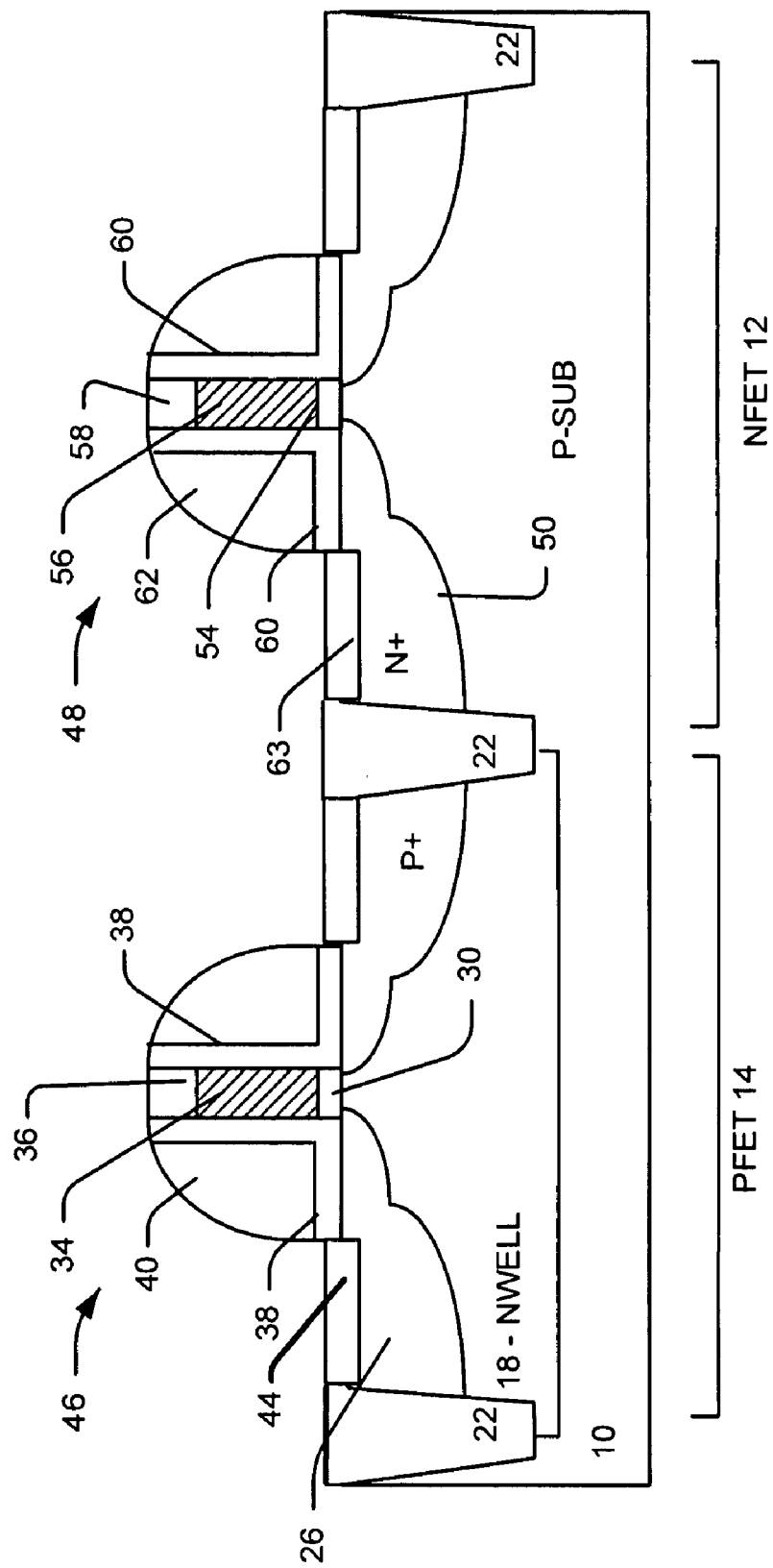
FIGS. 1 through 5 are cross sectional views for illustrating a method for manufacturing semiconductor device according to a first example embodiment of the present invention.

For example, referring to FIG. 1, we provide a substrate 10 with first region (e.g., PFET region 14) where first type devices (e.g., PFET devices) can be made and a second region 12 (e.g., NFET region 12) where second type devices (e.g., NFET devices) can be made.

The substrate can be any type of semiconductor structure, such as a wafer, or a SOI substrate and a p-doped silicon wafer.

This example description will refer to the first region as the NFET region 12 and the second region as the PFET region 14, but the regions obviously can be interchanged, and the conductivity of the dopant reversed, and this description is not limiting.

We provide a PFET transistor 46 in the PFET region 14 and a NFET transistor 48 in the NFET region 12. The transistors are representative and can have different structures than shown in the figs. More than one transistor can be formed in a region.

An example PFET transistor 46 can be comprised of a PFET gate dielectric layer 30; a PFET gate electrode 34; a PFET gate silicide layer 36 (or cap gate layer) over the PFET gate electrode 34; a PFET spacer(s) 38 40, PFET source and drain regions 26 (e.g., S/D and SDE's) adjacent to the gate electrode 34; PFET silicide regions 44 on the PFET source and drain regions 26. A n-well 18 can be in the PFET region 14.

The NFET transistor 48 can be comprised of a NFET gate dielectric layer 54; a NFET gate electrode 56; a NFET gate silicide layer (cap layer) 58 over the NFET gate electrode 56; a NFET spacer 60 62, NFET source and drain regions 50 (e.g., S/D and SDE's) adjacent to the NFET gate electrode 56; and NFET silicide regions 63 on the NFET source and drain regions 50.

B. Form Stress Relief Layer 64

Figure 2:
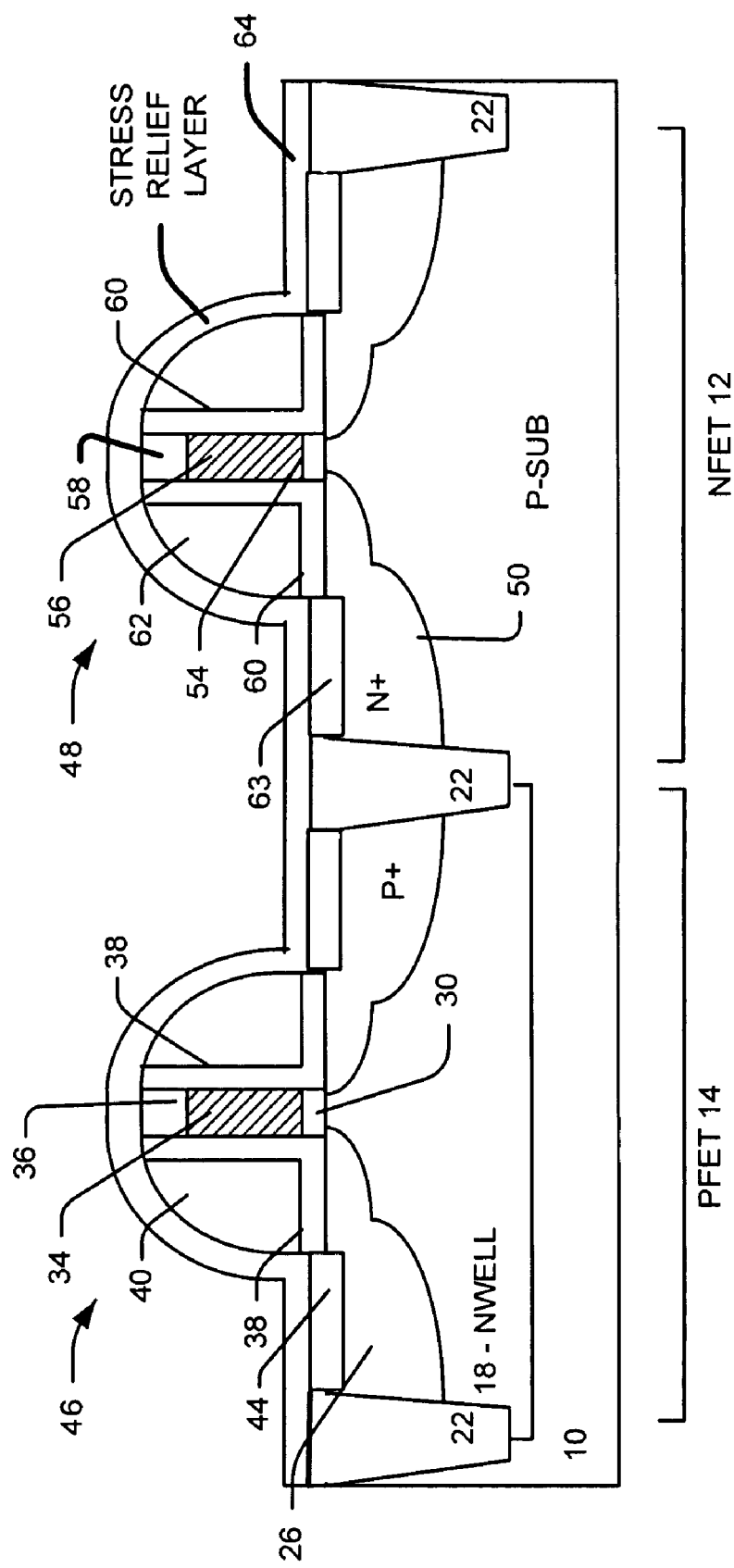
Figure 3:
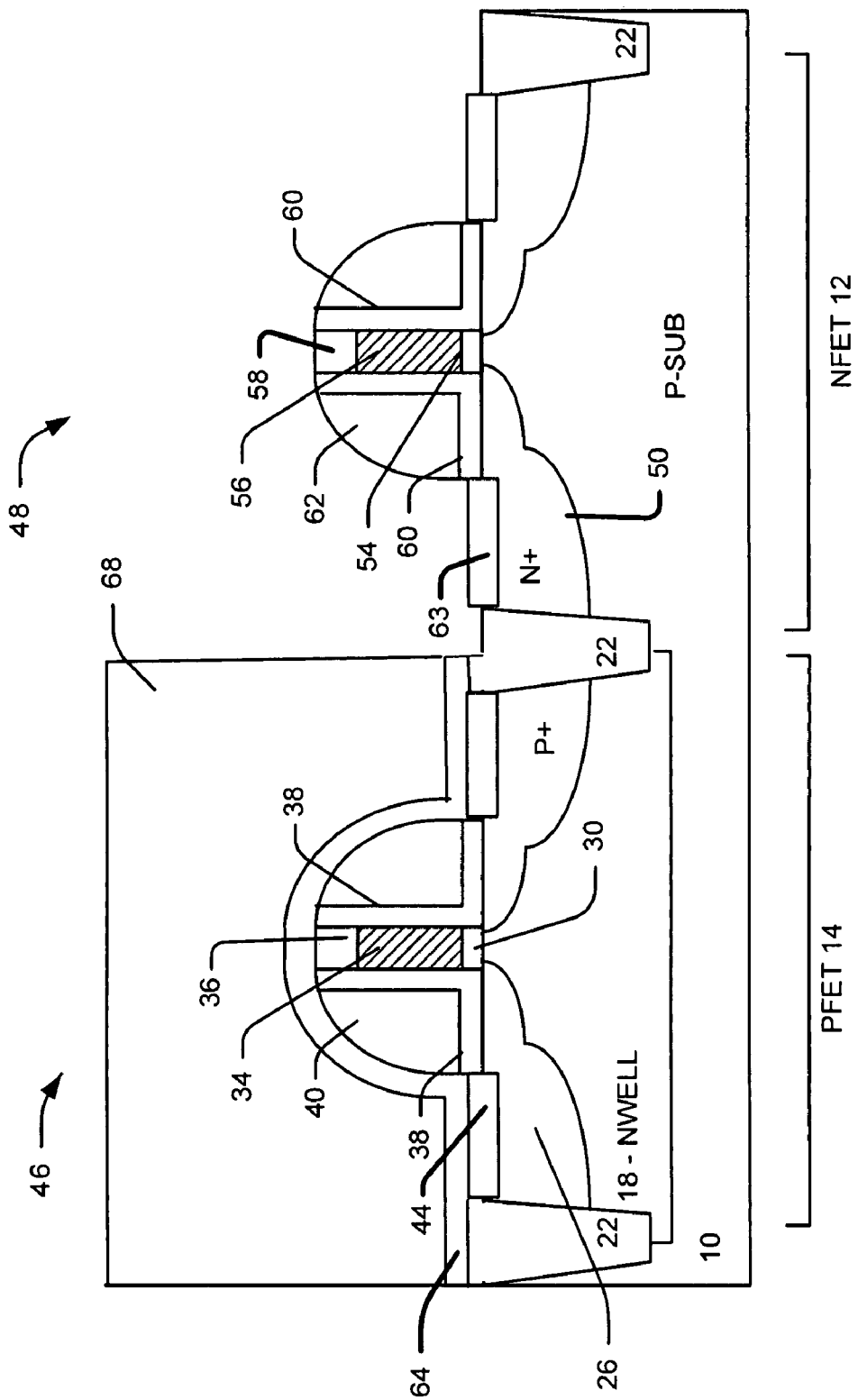

Referring to FIGS. 2 and 3, we form stress relief layer 64 over the substrate 10 surface in the PFET region 14 and not in the NFET region 12.

Referring to FIG. 2, we form a stress relief layer 64 over the substrate 10 surface.

Referring to FIG. 3, we form a resist pattern 68 over the PFET region 14. We then pattern the stress relief layer 64 to leave the stress relief layer 64 in the PFET region 14 over the PFET Transistor and not on the NFET region 12. We remove the resist layer.

The stress relief layer is preferably comprised of a material with neutral stress or opposite stress relative to the subsequent first stress layer 70. For example, (see FIG. 4) for use with a tensile stress (SiN) layer 70, the stress relief layer can be comprised of oxide with a thickness between 100 and 500 angstroms (~200+/−100 Å) and have a compressive stress (opposite the overlaying stress layer).

The stress relief layer 64 can comprise of a material that has a neutral stress or an opposite stress relative to the subsequently formed stress layer 70. The amount of stress in the stress relief layer depends upon the stress in the stress layer and the amount of stress desired in the channel of the MOS transistors. Neutral can mean a stress between +1.0 and −1.0 GPa and preferably between +0.5 and −0.5 GPa and more preferably about 0 GPa.

In the first embodiment, with a (subsequently formed) tensile first stress layer 70, the stress relief layer can have a neutral stress or a compressive stress. The compressive stress relief layer can have a compressive stress larger in magnitude than 0 and between −0.001 and −3.6 GPa or preferably between −0.4 GPa and −3.6 GPa.

The stress relief layer can be comprised of silicon oxide, silicon oxynitride, and silicon nitride. The stress relief layer and can have a thickness between 100 and 500 angstroms.

The stress relief layer 64 is preferably comprised of silicon oxide having a thickness between 100 and 300 angstroms.

C. Form a First Stress Layer

Figure 4:
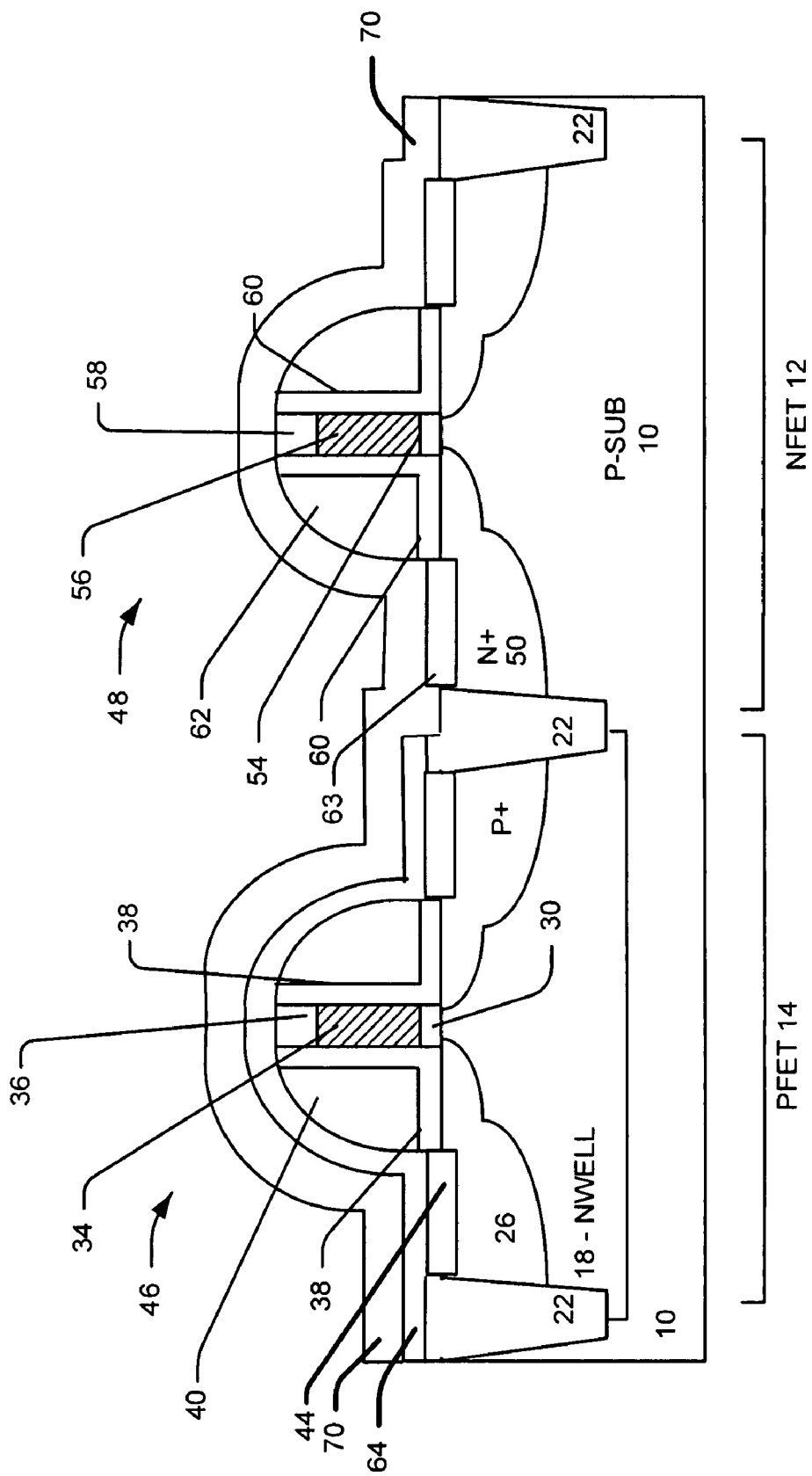

Referring to FIG. 4, we form a first stress layer 70 (e.g., silicon nitride layer) over or on the NFET region 12 of the substrate and the stress relief layer 64 in the PFET region 14.

The first stress layer 70 may be comprised of SiN, SiON, or SiC.

The first stress layer 70 has an internal stress that is transferred down to the substrate where the devices are located.

In the first embodiment using a tensile first stress layer 70, the first stress layer 70 can have a tensile stress of between +0.4 GPa and +2.5 GPa and a thickness between 200 and 1200 angstroms (Å).

The stress relief layer can reduce the stress in the substrate region from the overlying first stress layer.

A compressive stress layer induces a compressive stress in the channel region of the underlying FET.

A tensile stress layer 70 induces a tensile stress in the channel region of the underlying FET. For a NFET, a tensile stress layer over the NFET improves NFET device performance by putting a tensile stress on the NFET channel. The stress layer puts a compressive stress on the S/D regions which put a tensile stress on the channel in the direction of the channel length.

For NFETs, device performance increases an overlying tensile stress layer 70 that induces a tensile (+ve) strain in the NFET channel. In contrast, NFET device performance decreases NFET channel compressive strain (−ve).

For PFETs, device performance decreases with tensile (+ve) strain in the PFET channel and device performance increases PFET channel compressive strain (−ve).

The NFET device performance is enhanced due to the overall net tensile stress from the tensile stress layer 70 on the substrate. A theory is that the substrate lattice is pulled further apart due to the tensile strain resulting in improved electron mobility.

Also, the degradation in the PFET Tx 46 performance is reduced/eliminated due to the inclusion of the stress relief layer 64 under the nitride layer 70 that reduces the tensile stress in the channel region.

D. Completing the Devices

Referring to FIG. 5, we can form a dielectric layer 74 over the silicon first stress layer 70. We then form interconnects (e.g., 76 78) to contact the PFET transistor 46.

E. Review of Non-Limiting Features of the First Example Embodiment

A feature of an embodiment is that one type of stress film (e.g., compressive or tensile stress) is formed over one region and a second type (e.g., opposite stress type) is formed over a second region. For example, a tensile stress layer can be formed over a NFET region and a compressive stress layer can be formed over the PFET region. The tensile stress layer increases the NFET device performance because of enhanced electron mobility.

Another feature is the stress relief layer 64 in the PFET region 14 reduces or eliminates the tensile stress from the (e.g., Nitride) stress layer 70. The strain effects on device performance is more evident at smaller linewidths. The stress relief layer can have a neutral stress or stress opposite the stress layer 70.

F. Second Example Embodiment

Stress Relief Layer on NFET Region

Figure 6:
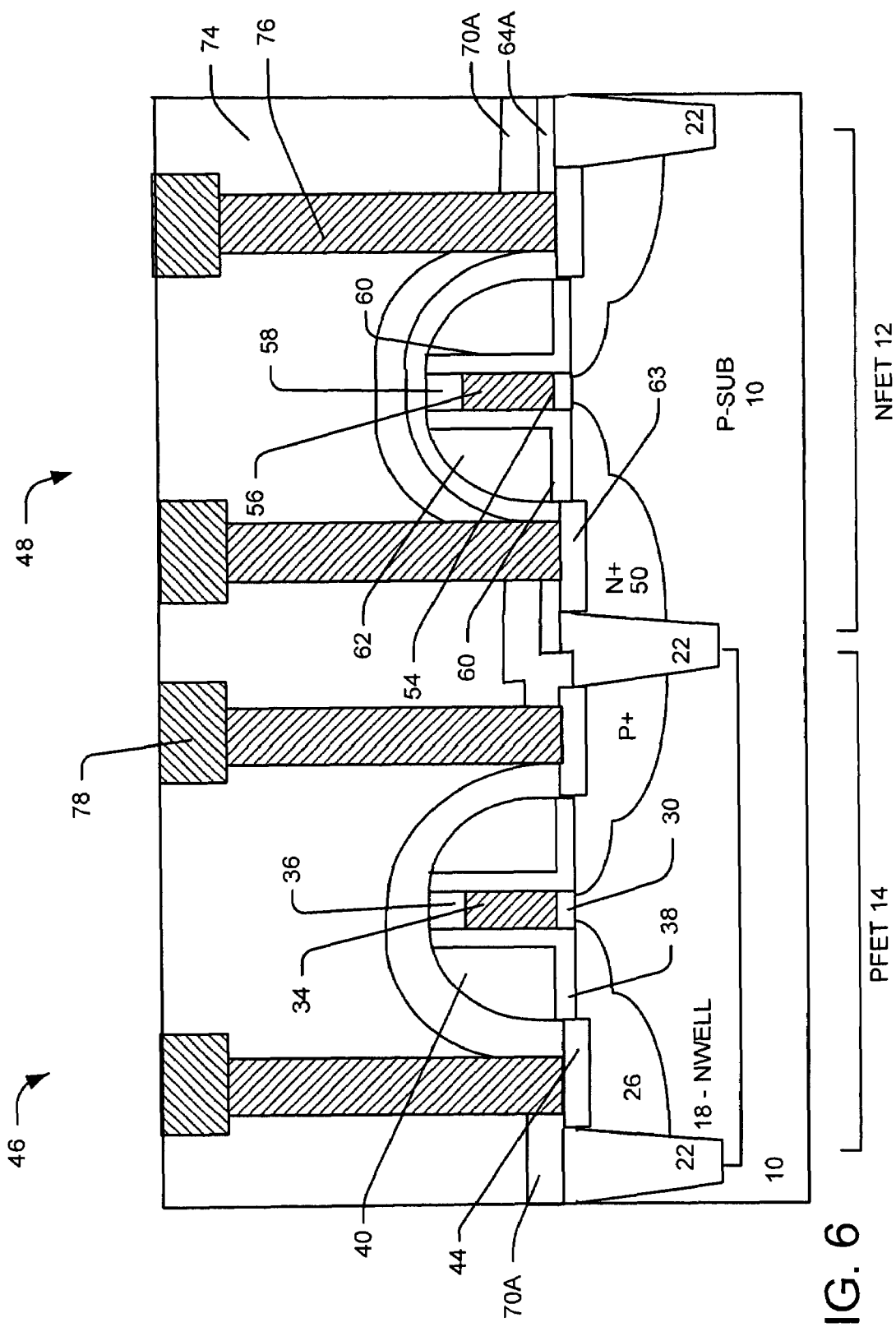
FIG. 6 is cross sectional view for illustrating a method for manufacturing semiconductor device according to a second example embodiment of the present invention.

Referring to FIG. 6, in a second example embodiment, the stress relief layer 64A is formed over the NFET region 12 and not over the PFET region 14. The stress relief layer 64A can be formed over the substrate and then patterned. Then, the first stress layer 70A having an internal compressive stress (e.g., a compressive nitride layer) 70A is deposited over the entire substrate. The compressive stress layer 70A improves the performance of the PFET device 46 by putting a compressive strain on the PFET channel.

Therefore the PFET (channel) region 14 has a compressive stress that increases device performance. The NFET region 12 preferably has about neutral stress caused by the stress relieve layer 64A that underlies the compressive stress layer 70A.

In the second embodiment, the stress relief layer 64A can have a neutral stress or a tensile stress. A neutral stress relief layer can have stress between +0.5 and −0.5 GPa or a stress between −1.0 and +1.0. GPa. The stress relief layer with a tensile stress can have a tensile greater than 0 GPa and preferably between about 0.001 and +2.5 GPa or preferably between +0.4 GPa and +2.5 GPa (or higher).

In a second embodiment, where a compressive stress layer 70A is formed, the stress layer 70A can have a compressive stress between −0.4 GP and −3.6 GPa.

G. Non-Limiting Example Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor device comprising:
   providing a substrate having first and second regions defined thereon, the first region comprising a first transistor and the second region comprising a second transistor;
   forming a stress relief layer over the substrate covering the first and second regions and patterning the stress relief layer to remove the stress relief layer from the first region while leaving the stress relief layer on the second region over the second transistor; and
   forming a stress layer on first and second regions of the substrate, the stress layer having a first stress, the stress layer covering the stress relief layer on the second region,
   wherein the first stress of the stress layer improves the performance of the first transistor, and
   the stress relief layer comprises a neutral stress or a second stress opposite the first stress of the stress layer to reduce performance degradation of the second transistor caused by the first stress layer.

2. The method of claim 1 wherein:
   the first transistor comprises a n-type transistor;
   the second transistor comprises a p-type transistor;
   the first stress comprises a tensile stress; and
   the second stress comprises compressive stress.

3. The method of claim 2 wherein:
   the stress relief layer comprises silicon oxide, silicon oxynitride or silicon nitride; and
   the stress layer comprises silicon nitride, silicon oxynitride or silicon carbide.

4. The method of claim 3 wherein forming the stress relief layer comprises forming a stress relief layer having a thickness between 100 and 300 angstroms.

5. The method of claim 2 wherein:
   the stress relief layer comprises silicon oxide; and
   the stress layer comprises silicon nitride.

6. The method of claim 5 wherein forming the stress relief layer comprises forming a stress relief layer having a thickness between 100 and 300 angstroms.

7. The method of claim 2 wherein the stress layer exerts the first stress in source and drain regions of the first transistor, which exerts the first stress in a channel region of the first transistor in a direction of a channel length of the first transistor.

8. The method of claim 7 wherein the first stress is between about +0.4 GPa and +2.5 GPa.

9. The method of claim 1 wherein the stress layer exerts the first stress in source and drain regions of the first transistor, which exerts the first stress in a channel region of the first transistor in a direction of a channel length of the first transistor.

10. A method for forming a semiconductor device comprising:
    defining first and second regions on a substrate;
    forming first and second transistors in first and second regions;
    forming a stress relief layer over the substrate covering the first and second regions and patterning the stress relief layer to remove the stress relief layer from the first region while leaving the stress relief layer on the second region over the second transistor; and
    depositing a stress layer on first and second regions of the substrate, the stress layer having a first stress, the stress layer covering the stress relief layer on the second region,
    wherein the first stress of the stress layer improves the performance of the first transistor, and
    the stress relief layer comprises a neutral stress or a second stress opposite the first stress of the stress layer to reduce performance degradation of the second transistor caused by the first stress layer.

11. The method of claim 10 wherein the stress layer exerts the first stress in source and drain regions of the first transistor, which exerts the first stress in a channel region of the first transistor in a direction of a channel length of the first transistor.

12. The method of claim 10 wherein:
    the first transistor comprises a n-type transistor;
    the second transistor comprises a p-type transistor;
    the first stress comprises a tensile stress; and
    the second stress comprises compressive stress.

13. The method of claim 12 wherein:
the stress relief layer comprises silicon oxide, silicon oxynitride or silicon nitride; and
the stress layer comprises silicon nitride, silicon oxynitride or silicon carbide.

14. The method of claim 10 wherein:
the first transistor comprises a n-type transistor;
the second transistor comprises a p-type transistor;
the first stress comprises a tensile stress; and
the second stress comprises compressive stress.

15. The method of claim 10 wherein:
the stress relief layer comprises silicon oxide, silicon oxynitride or silicon nitride; and
the stress layer comprises silicon nitride, silicon oxynitride or silicon carbide.

16. A method for forming a semiconductor device comprising:
providing a substrate having first and second regions defined thereon, the first region comprising a first transistor and the second region comprising a second transistor;
forming a stress relief layer on the second region of the substrate to cover the second transistor by forming a stress relief layer over the substrate covering the first and second regions and patterning the stress relief layer to remove the stress relief layer from the first region while leaving the stress relief layer on the second region over the second transistor; and
forming a stress layer on first and second regions of the substrate, the stress layer having a first stress, the stress layer covering the stress relief layer on the second region.

17. The method of claim 16 wherein:
the first stress of the stress layer improves the performance of the first transistor; and
the stress relief layer comprises a neutral stress or a second stress opposite the first stress of the stress layer to reduce performance degradation of the second transistor caused by the first stress layer.

18. The method of claim 16 wherein the stress layer exerts the first stress in source and drain regions of the first transistor, which exerts the first stress in a channel region of the first transistor in a direction of a channel length of the first transistor.

* * * * *